(12) United States Patent
Desphande et al.

(10) Patent No.: US 6,869,542 B2
(45) Date of Patent: Mar. 22, 2005

(54) HARD MASK INTEGRATED ETCH PROCESS FOR PATTERNING OF SILICON OXIDE AND OTHER DIELECTRIC MATERIALS

(75) Inventors: Sadanand V. Desphande, Fishkill, NY (US); David Dobuzinsky, New Windsor, NY (US); Arpan P. Mahorowala, Bronxville, NY (US); Tina Wagner, Newburgh, NY (US); Richard Wise, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/249,047

(22) Filed: Mar. 12, 2003

(65) Prior Publication Data

US 2004/0178169 A1 Sep. 16, 2004

(51) Int. Cl.$^7$ .............................................. H01L 21/00
(52) U.S. Cl. ............................. 216/51; 216/67; 216/72; 216/79; 438/723; 438/724; 438/743; 438/744
(58) Field of Search .............................. 216/51, 67, 72, 216/79; 438/723, 724, 743, 744

(56) References Cited

U.S. PATENT DOCUMENTS

| 5,667,631 | A | 9/1997 | Holland et al. |
| 6,014,943 | A | 1/2000 | Arami et al. |
| 6,120,697 | A | 9/2000 | Demmin et al. |
| 6,309,979 | B1 | 10/2001 | Patrick et al. |
| 6,316,167 | B1 | 11/2001 | Angelopoulos |
| 6,387,287 | B1 | 5/2002 | Hung et al. |
| 6,410,451 | B2 | 6/2002 | Nguyen et al. |
| 6,451,703 | B1 | 9/2002 | Liu et al. |
| 6,699,784 | B2 * | 3/2004 | Xia et al. ................... 438/637 |

* cited by examiner

Primary Examiner—Allan Olsen
(74) Attorney, Agent, or Firm—Steven Capella; Graham Jones

(57) ABSTRACT

Form an opening in a dielectric layer formed on a substrate comprises depositing a hard mask composed of an etch resistant material over a dielectric layer, e.g. a silicon oxide. Use a photoresist mask to expose the hard mask. Use a fluorocarbon plasma to etch through the window to form an opening through the hard mask. Then etch through the hard mask opening to pattern the dielectric layer. The hard mask comprises an RCH/RCHX material with the structural formula R:C:H or R:C:H:X, where R is selected from Si, Ge, B, Sn, Fe, Ti and X is selected from O, N, S and F. The plasma etching process employs a) a gas mixture comprising $N_2$; fluorocarbon ($CHF_3$, $C_4F_8$, $C_4F_6$, $CF_4$, $CH_2F_2$, $CH_3F$); an oxidizer ($O_2$, $CO_2$), and a noble diluent (Ar, He); b) a high DC bias (500–3000 Volts bias on the wafer); 3) medium pressure (20–100 mT.; and d) moderate temperatures (−20 to 60°).

17 Claims, 5 Drawing Sheets

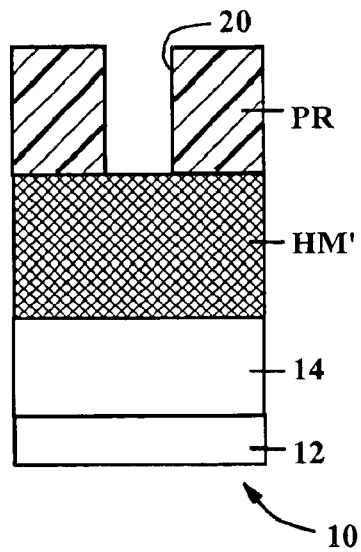
FIG. 2A LITHOGRAPHIC PRINT
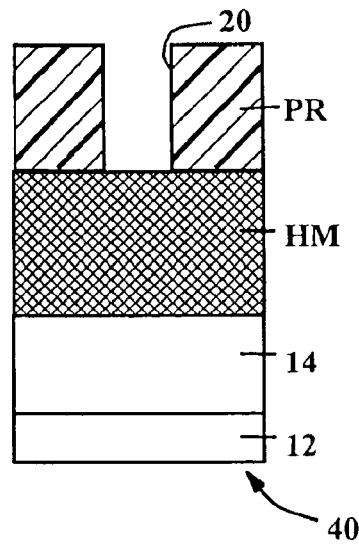
FIG. 4A LITHOGRAPHIC PRINT
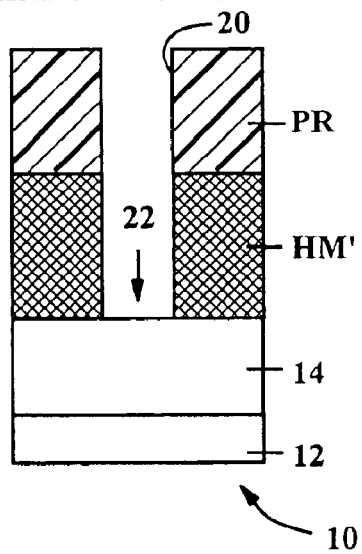
FIG. 2B CHLORINE($Cl_2$) HARD MASK OPEN
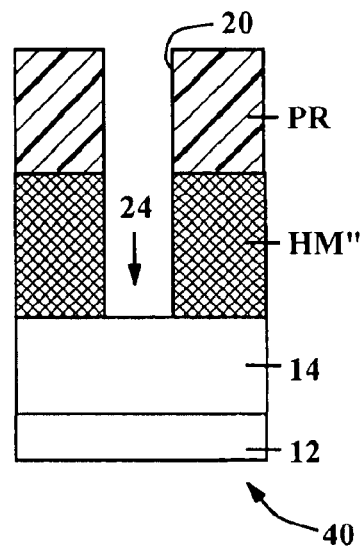
FIG. 4B FLUOROCARBON HARD MASK OPEN

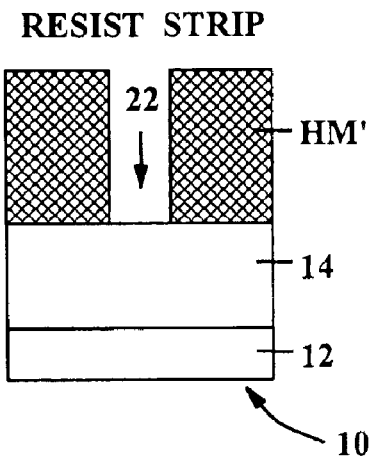
FIG. 2C RESIST STRIP
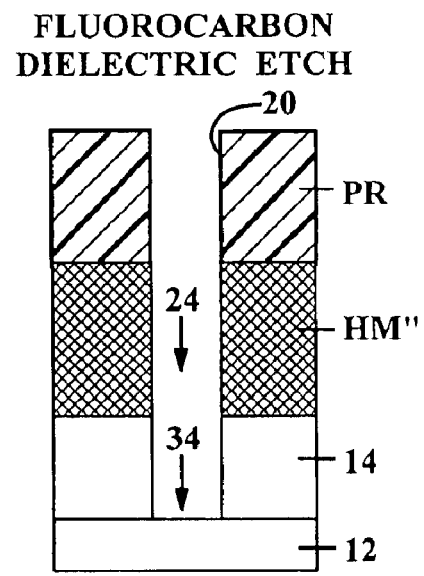
FIG. 4C FLUOROCARBON DIELECTRIC ETCH
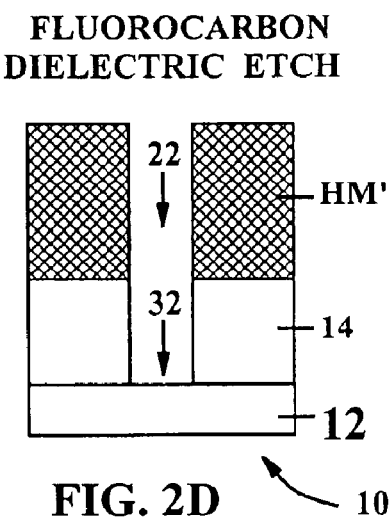
FIG. 2D FLUOROCARBON DIELECTRIC ETCH
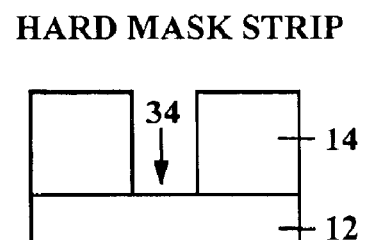
FIG. 4D HARD MASK STRIP
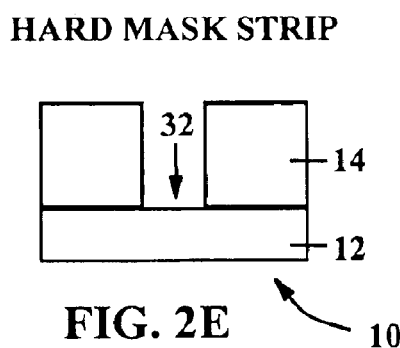
FIG. 2E HARD MASK STRIP

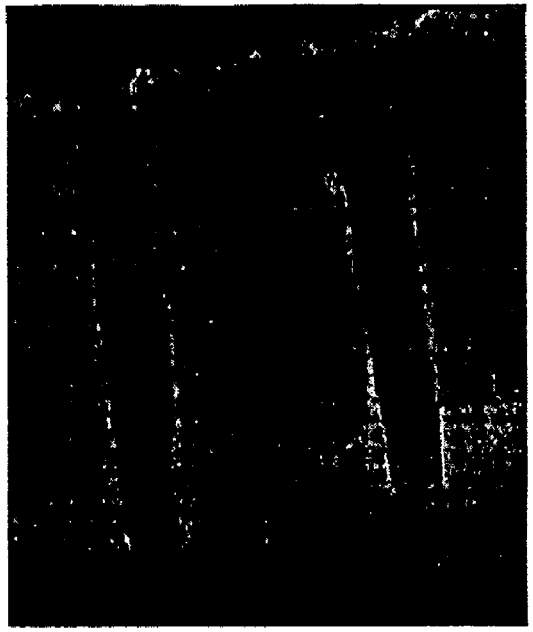
FIG. 6A  FIG. 6B
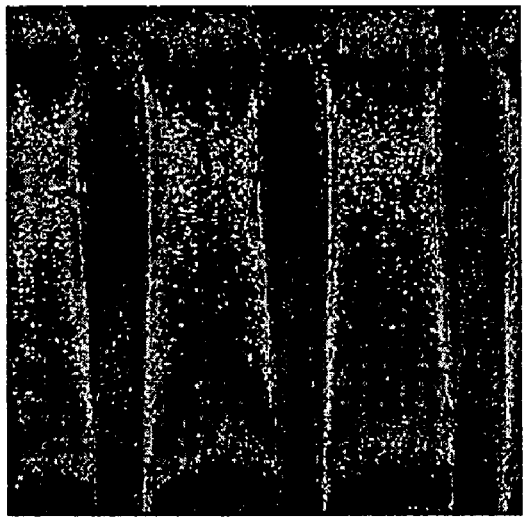
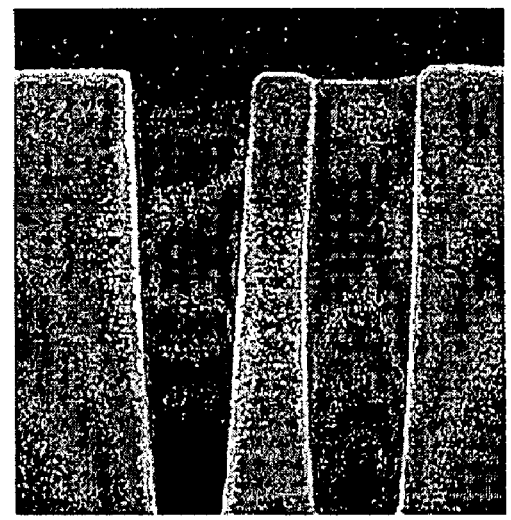
FIG. 8A  FIG. 8B

HARD MASK INTEGRATED ETCH PROCESS FOR PATTERNING OF SILICON OXIDE AND OTHER DIELECTRIC MATERIALS

BACKGROUND OF INVENTION

This invention relates to formation and patterning of a hard mask which is adapted for use in forming holes in an underlying layer, and more particularly to formation of openings in the underlayer, including trench holes. The openings are adapted for providing formation of active semiconductor devices as well as inactive devices including capacitors and resistors, and including structures such as lines/spaces, vias, and contacts.

In the manufacture of semiconductor devices, multiple layers of various materials are formed and patterned. To form the patterns in various layers or in the substrate upon which devices are being formed, photolithographic techniques are frequently used in which a photoresist layer is formed over a layer of material in which or on which features of a semiconductor device are to be fabricated. Then the photoresist is exposed to a master mask and developed to form windows through the photoresist. In additive processes, materials can be plated onto a workpiece or implanted into a workpiece through the windows. In subtractive processes, openings can be formed by etching through the windows into the layers or layers below the photoresist. In the case of etching through the windows to form such openings, high energy plasma etching is employed. The plasma etching process employs highly energetic ions and plasma energized atomic particles to etch through the material exposed at the bottoms of the windows through the photoresist layer.

To remain cost and performance competitive the semiconductor manufacturing industry and the tooling industry are continuously required to develop new processes and new tools for manufacturing semiconductor devices with ever increasing device densities. The increasing device densities are achieved by decreasing the sizes of the features that are produced. This requirement has led to the development of enhanced photolithographic manufacturing processes, capable of providing increased accuracy in the production of features with ever smaller dimensions. However it is difficult to implement such lithographic manufacturing processes. To achieve the shrinking device dimensions, new photolithographic materials, processes and tools are being developed including higher Numerical Aperture (NA) tools. While higher NA tools allow for improved photolithographic resolution, the problem is that there is a reduced depth of focus of aerial images projected onto the photoresist by the photolithographic tool.

Because of the reduced depth of focus, a thinner layer of photoresist is required. As the photoresist becomes thinner and thinner, the problem is that the photoresist becomes less effective as a mask for subsequent dry etch image transfer to the underlying layers including the substrate, i.e. most if not all of the photoresist is etched away during the subsequent pattern transfer process.

As photolithography evolves from larger scale 248 nm exposure to smaller scale 193 nm exposure, a consequent change in the photoresist chemistry has been required. The generation of 193 nm photoactive photoresists are much less resistant to bombardment by highly energetic ions and plasma erosion than previous photoresists designed for 248 nm exposure. Furthermore, increasingly aggressive ground rule targets are required, reducing the available depth of focus and hence the total thickness of the layer of photoresist available for etching.

For example, 0.13 $\mu$m technology used a mature 248-nm positive Deep Ultra-violet (DUV) photoresist material. (e.g. UV™ 82 photoresist of Shipley Company, L.L.C., Marlborough, Mass. Rohm & Haas) of at least 470 nm thickness. This photoresist would typically be used to etch an underlying organic AntiReflective Coating (ARC) film consuming approximately 100 nm of the thickness of the photoresist, leaving only the remaining 500 nm to be used to etch an underlying silicon dioxide material. In contrast, 0.11 mm technology employs a much more delicate 193 nm imaging system using argon fluoride (ArF) and photoactive ArF photoresist with a photoresist thickness of only 300–350 nm. Approximately 100 nm of this thinner ArF photoresist is then used to etch a 100 nm ARC coating, leaving only 200–250 nm of more sensitive ArF photoresist for the underlying oxide etch.

The problem is exacerbated at many levels, for example the local interconnect or Metal Contact (MC) level. The minimum spacing between features of a pattern to be exposed such as a bar and a mini-bar is even more susceptible to sputtering than the field area. For aggressive groundrules such as CMOS devices with 90 nm logic and smaller, it has become increasingly difficult to pattern oxide contacts for the MC level. Due to these constraints, use of intermediate layers of hard mask materials below the photoresist layer is becoming increasingly common in the microelectronics industry. The nature of such hard mask materials dictates that they etch much differently from the underlying film. In the case of tunable ARC (Anti-Reflective Coating) hard mask materials, a separate tool has been required to make an opening through the hard mask layer. For this reason, tunable ARC materials have been developed as a tunable ARC materials hard mask material for etching of silicon dioxide layers.

U.S. Pat. No. 6,316,167 of Angelopoulos et al. entitled Tunable Vapor Materials as Antireflective Coatings, Hardmasks and as Combined Antireflective Coating/hardmasks and Methods of Fabrication Thereof and Application Thereof describes a lithographic structure and method of fabrication and use thereof having a plurality of layers at least one of which is a an RCH or and RCHX layer which comprises a inorganic material having structural formula R:C:H or R:C:H:X, wherein R is selected from the group of one or more of Si, Ge, B, Sn, Fe, and Ti; and X is selected from the group of one or more of O, N, S, and F. RCH/RCHX layers are useful as hardmask layers, anti-reflection layers and hardmask anti-reflection layers.

The RCH/RCHX layer can be vapor-deposited and patterned by patterning the energy active material and transferring the pattern to the RCH/RCHX layer. However, the Angelopoulos patent does not describe methods of forming openings in the tunable ARC layers produced nor does it suggest use of the tunable ARC layers as a hard mask formed by etching through a photoresist mask to form openings therein.

In Example 5, the patent states as follows: This Example illustrates the ability to pattern the R:C:H:X material with a conventional deep UV photoresist mask using plasma etching. As can be seen in FIG. 8, a halogen or/and fluorocarbon-based chemistry was used in a high-density plasma etcher to delineate 150 nm line-and-space features in a 240 nm thick RCHX film with excellent anisotropy and adequate selectivity of 1.2 with respect to the photoresist. Blanket etch selectivities in excess of 4 with respect to photoresist were observed with less aggressive plasma etches. Owing to the vertical profiles obtainable with minimal etch bias and the excellent etch resistance to common substrate materials such as silicon oxide and silicon nitride (as described in the Example 6), the R:C:H:X material is an excellent candidate for hard mask.

In Example 6, the patent states as follows: This Example shows the excellent etch resistance of the R:C:H:X material to fluorocarbon plasmas used to etch silicon oxide and silicon nitride. The blanket etch rates measured for the RCHX film and silicon oxide for two different plasma chemistries which are summarized in FIG. 9 indicate etch selectivities of ~7 and ~13, respectively. The blanket etch rates measured for the RCHX film and silicon nitride and shown in FIG. 9 indicate an etch selectivity greater than 4. This data suggests that the R:C:H:X material possess excellent hard mask characteristics for subsequent etches.

In Example 7, the patent states as follows: The following Example explains an integration scheme using the deposited RCHX film which reduces the need of one material and one process step. The RCHX film in this case replaces the BARC and oxide hardmask layers thus performing the role of a combined ARC and hardmask for the subsequent nitride etch step. The photoresist patterns are reproducibly transferred into the deposited RCHX film using a $Cl_2$ chemistry on a high-density plasma etcher. This is enabled by the reasonably selective and highly anisotropic nature of the etch (FIG. 8). The blanket RCHX film to photoresist selectivity of ~2 is superior to the conventional BARC to photoresist selectivities of ~1. This means that compared to the conventional process sequence, more photoresist remains intact going into the next etch step. The pattern is then transferred into the nitride with a fluorocarbon-based plasma since the nitride to deposited RCHX film selectivity is reasonably high.

In Example 8, the patent states as follows: This Example shows the use of the deposited RCHX film as a replacement to conventional bottom ARC in a conventional stack. The process flow is summarized in FIG. 11. The photoresist patterns are transferred into the deposited RCHX film using a $Cl_2$ plasma etch after which the photoresist is ashed. The RCHX feature is transferred into the oxide layer with a fluorocarbon plasma; the low etch rate of the RCHX compared to that of oxygen makes this pattern transfer possible. This inherent selectivity for two different fluorocarbon plasmas is shown in FIG. 9. The remaining process flow is similar to the conventional process flow shown in FIG. 11. When using the RCHX as an ARC, less aggressive etching conditions leading to higher etch selectivities with respect to photoresist can be used because the film will be only ~90 nm thick. This will prevent the excessive photoresist loss observed in conventional ARC-open etches.

Tunable etching resistant ARC materials have an optical property which is tunable as discussed in the Angelopoulos patent where a tunable index of refraction and extinction coefficient are described which can be optionally graded along the film thickness to match the optical properties of the substrate and the imaging photoresist, but that is not a feature employed in the method of this invention since it is simply the hard mask features which these materials also possess which are of importance in connection with this invention.

U.S. Pat. No, 6,120,697 of Demmin et al. "Method of Etching Using Hydrofluorocarbon Compounds" describes an etching composition comprising:

(A) a hydrofluorocarbon etchant compound having the formula $C_xH_yF_z$ wherein: x=3, 4 or 5;
$2x \geq z \geq 1y$ or $1.5y$; and
$y+z=2x+2$; and (B) a second material, different from the etchant compound, to enhance or modify the plasma etching characteristics of the etchant compound wherein said second material is selected from the group consisting of $O_2$, $H_2$, $N_2$, $CH_4$, He, Ar, and $C_1$–$C_5$ hydrofluorocarbons. The Demmin et al. patent states that examples of materials that can be etched by the HFC etchant compounds include, but are not limited to:

dielectrics such as carbides, borides and suicides of metals or semi-metals, for example, tungsten silicide;

insulators, such as oxides, nitrides of metals or semi-metals, for example, $SiO_2$, $Si_3N4$, silicon oxynitride, BPSG, and fluorosilicate glass;

III–V semiconductor compounds such as indium phosphide;

elemental materials, such as silicon, polysilicon, W, Ti, V, Ge, Si—Ge; and combinations of two or more thereof.

The patent states at Col. 3, line 25 et seq. as follows:

It has been found also that the HFC etchant compounds for use in the present invention exhibit good selectivity in response to intentional variations in plasma etching conditions. More specifically, it has been found that the relatively high hydrogen content of the HFC etchant compounds tends to promote polymerization on the surface of certain materials and not others under certain conditions. This polymerization retards etching, thus resulting in selectivity of the non-polymerized surfaces over the polymerized surfaces.

"As discussed In greater detail in the examples below, tests were conducted to determine the role operating conditions played in the selectivity of the HFC etchant compounds for use in the present invention. For example, it was found that, for HFC-245fa, relatively high bias and power and low pressure tend to increase the selectivity of $SiO_2$ over Si, and relatively low bias and high pressure and power tend to increase the selectivity of $SiO_2$ over $Si_3N_4$. For HFC-236, relatively low bias and power and high pressure tend to increase the selectivity of $SiO_2$ over Si, and relatively low pressure and power and medium bias tend to increase the selectivity of $SiO_2$ over $Si_3N_4$. Other combinations of operating variables can also be used to impart selectivity over these and other materials as shown in the examples. Additionally, it should be noted that these results are offered only as an indication that selectivity can be achieved by intentionally varying conditions, and should not be construed as an optimization for particular selectivities. Indeed, one skilled in the art should be capable of improving these selectivities as well as other selectivities by optimizing process conditions and the apparatus used."

Accordingly, significant selectivities of $SiO_2$ over Si and $SiO_2$ over $Si_3N_4$, among others, have been achieved by varying operating parameters such as pressure, bias, and power . . . . In a preferred embodiment, the etching process is performed under conditions such that the etch ratios of $SiO_2$ over Si and/or $SiO_2$ over $Si_3N_4$ are no less than about 2:1, even more preferably no less than about 5:1, and still more preferably no less than about 7:1.

In current state of the art of 193 nm lithography, an organic ARC film is etched 1:1 with photoresist, and the silicon oxide selectivity to photoresist is 3:1 or so. Thus the overall effective selectivity is 3:1, so that 100 nm of photoresist is able to pattern a thickness of only 300 nm of silicon oxide (also known as oxide). We have found that tunable ARC materials are an excellent choice, since tunable ARC materials are the only commonly available silicon materials which sputter less readily than silicon oxide. The "tunability" of the material of the tunable etch resistant ARC material referred to herein does not pertain to this invention; but it has to do with an optical property of these materials when they are used as an anti-reflective coating (ARC) layer for patterning using the ARC optical characteristics without a mask. Here the tunable ARC layers are used simply as hard masks which are employed for the highly selective etching characteristics thereof when employed in connection with etching a dielectric such as silicon dioxide in accordance with this invention.

FIG. 1A illustrates a problem of loss of critical dimension encountered when processing with a conventional hard mask material. FIG. 1A shows a schematic sectional view of a pair of hypothetical structures 8 composed of a conventional hard mask material, e.g. silicon nitride ($Si_3N_4$) or polysilicon have been formed by etching through a planar layer of the hard mask material. Structures 8 have been patterned with a mask (not shown for convenience of illustration) which had been formed over the planar layer of the hard mask material for the intended purpose of providing an opening at the base of the structures 8 with a critical dimension (CD).

FIG. 1A shows that as a result of plasma etching of either silicon nitride or polysilicon features such features sputter too readily, resulting in severe mask faceting manifested by the tapered (sloping) sidewalls TSW and an excessively wide gap between the structures 8 which is wider by the error value "δ" than the CD value so that there has been a loss of the Critical Dimension caused by widening of the gap at the base of the structures 8. This undesirable widening of the gap between the structures 8 has been caused by the sputtering causing unwanted etching of the sidewalls of the structures 8, which has produced the faceting, Thus, the CD value has been increased by the error value "δ" due to formation of tapered sidewalls TSW with the bottoms thereof spaced by CD+"δ", whereas the original spacing between the bottoms of the structures 8 would have been the critical dimension CD, if it were not for the unwanted faceting illustrated in FIG. 1A. This growth in the CD, especially at the top of the feature, can greatly exacerbate short circuiting between closely packed structures, and is a leading cause of failure in device manufacture.

FIG. 1B shows that for tunable ARC materials indicated by structures 9 (patterned with the same original mask as the structures 8 of FIG. 1A) there are vertical sidewalls VSW (below the tapered upper walls TUW) that maintain spacing with the original CD value of the mask (not shown) at the bottom of the sidewalls of the structures 9 which are spaced by the original CD value. This enhanced result has been achieved since tunable ARC materials 9 are more resistant to sputtering during plasma etching. Tunable ARC materials are a suitable replacement not only for silicon nitride and polysilicon hard mask layers but are also suitable replacement for organic ARC materials employed with a single layer resist.

FIG. 1B shows that for tunable ARC materials indicated by structures 9 (patterned with the same original mask as the structures 8 of FIG. 1A) there are vertical sidewalls VSW below the tapered upper walls TUW that maintain spacing with the original CD value of the mask (not shown) at the bottom of the sidewalls of the structures 9, which are spaced by the original CD value. This enhanced result has been achieved since tunable ARC materials 9 are more resistant to sputtering during plasma etching. Tunable ARC materials are a suitable replacement, not only for a silicon nitride and polysilicon hard mask layer, but are also a suitable replacement for organic ARC materials employed with a single layer resist.

In addition to incompatibilities of materials, the chlorine based etch processes employ fundamentally different etch chamber designs, as described in more detail below. In fact, the erosion damage caused by chlorine in a fluorine chemistry etching chamber is so severe that even photoresist which had been previously exposed to a chlorine plasma is disallowed in dielectric chambers, since the photoresist has been found to have absorbed significant levels of chlorine radicals which are released during the fluorine chemistry etching process.

FIGS. 2A–2E illustrate the problems of a process flow for a process using chlorine for etching openings in a hard mask layer HM on a device 10. FIG. 3 is a flow chart of the process flow of the steps illustrated by FIGS. 2A–2E.

In FIG. 2A, a device 10, hereinafter referred to as Work In Process (WIP) 10, is shown with a base layer 12 composed of a material such as silicon, SOI, a dielectric, polysilicon or the like, upon which a dielectric layer 14, e.g silicon oxide, has been formed in accordance with step 70 in FIG. 3.

In step 71, shown in FIG. 3, form a hard mask layer HM over the dielectric layer 14. The hard mask layer HM is composed of an inorganic material (e.g. an RCH or an RCHX material comprising a tunable ARC).

In step 72, FIG. 3, form a photoresist mask PR with at least one window 20 therethrough over the hard mask layer HM using a lithographic printing process, as will be well understood by those skilled in the art of photolithography.

Referring to FIG. 2B, the WIP 10 of FIG. 2A is shown after step 73 in FIG. 3 of using a chlorine ($Cl_2$) etching process to form an opening 22 completely through the hard mask layer HM of FIG. 2A to the bottom thereof, directly below the window 20 through mask PR exposing the top surface of the dielectric layer 14. Thus, as the result of step 73, the hard mask layer HM has been transformed into a hard mask HM' with the opening 22 therethrough.

The step 73 is performed in a state of the art chamber such as a conventional processing chamber lined with quartz, or other lining materials compatible for use with a chlorine plasma process, which is referred to hereinafter as a "polysilicon" processing chamber.

Plasma etching chambers used are preferably capacitively coupled (single and multiple frequency) plasma etch chambers inductively or resonantly coupled plasma etch chambers. A state of the art chlorine gas ($Cl_2$) plasma etching process employs chamber liners resistant to the $Cl_2$ process, i.e. quartz, etc. There is a low inherent wafer bias (<200V D.C.) with the additional features of a low wattage power supply; a low voltage e-chuck (often bipolar); a low anode/cathode ratio; and a medium to high density plasma source. In addition there is a low level of polymerization during the etching process with the additional feature of little to no polymer control (i.e. heated surfaces, integrated cleans). An example of a commercially available plasma etching system suitable for use for etching the opening 22 through hard mask layer HM with a chlorine gas plasma using the chlorine etch process is the Transformer Coupled Plasma type of system often referred to as "inductively coupled plasma". In a TCP system power is applied to both the top and bottom electrodes in the etch chamber using different power sources in TCP, and the residence time of electrons in the plasma is typically longer, resulting in more collisions and more Ion generation resulting in increased ion density. Electrodes used in TCP can vary and can include coils and the like. TCP is well known in the art, and equipment which utilizes TCP, e.g. the Lam TCP® 9400,-series of high-density, polysilicon etching systems are commercially available.

U.S. Pat. No. 5,667,631 of Holland et al. entitled "Dry Etching of Transparent Electrodes in a Low Pressure Plasma Reactor" describes an example of use of a Lam TCP® 9400 system U.S. Pat. No. 6,309,979 of Patrick et al. entitled "Methods for Reducing Plasma-induced Charging Damage" describes an example of use of a Lam TCP® 9600 system shows and describes a simplified plasma reactor with a TCP™ coil. In the case of both the Holland et al. and the Patrick et al. patents " . . . the source etchant gases may include, for example, HBr, HCl, HI, $Br_2$, $I_2$ and/or $Cl_2$, or a mixture thereof. An additive, such as oxygen may be introduced and is believed to enhance the selectivity of ITO to other layers such as glass, photoresist, or silicon nitride." An appropriate lining material for chlorine is quartz. Other lining materials compatible for use with a chlorine plasma process are aluminum dioxide ($Al_2O_3$) and yttrium oxide ($Y_2O_3$).

Note that chlorine gas is generally not selective to photoresist (since there is no polymerization), and hence the material of hard mask HM etches only approximately as fast as the photoresist PR, limiting the thickness of the hard mask HM (in the 193 nm case) to approximately 200 nm. An inorganic tunable ARC type material film can be employed to form a hard mask HM' replacing the organic ARC material. Note that while the thickness of the photoresist would be reduced by the etching process, that is not shown for convenience of illustration.

Referring to FIG. 2C, the WIP 10 of FIG. 2B is shown after step 74 in FIG. 3 which comprises stripping the mask PR from the surface of the hard mask HM' in order to avoid chlorine cross-contamination, because the hard mask layer HM' was formed by etching in a chlorine plasma with the photoresist PR used as a mask. As stated above the erosion from chlorine is so severe that even the photoresist PR that has been exposed to chlorine is disallowed in dielectric chambers, since the photoresist PR has absorbed significant levels of incompatible chlorine radicals. Thus, step 74 is performed in a strip chamber which may be integrated with the etching of the hard mask layer HM to form mask HM', i.e. the hard mask etch step is followed immediately by a step of stripping away the photoresist PR from the surface of the WIP 10 in the same chamber, without exposure to the atmosphere.

Referring to FIG. 2D, the WIP 10 of FIG. 2C is shown after step 75 in FIG. 3 after the dielectric 14 has been etched in a fluorocarbon plasma in a fluorocarbon etching chamber using the hard mask HM' to pattern the dielectric layer 14. In this fluorocarbon plasma etching step, the plasma extends down through to the bottom of hard mask opening 22 in mask HM' where it reaches the exposed surface of the dielectric layer 14 to form an opening 32 through dielectric layer 14 down to expose the surface of base layer 12. The fluorocarbon plasma etching of step 75 is performed in a fluorocarbon processing chamber. Thus, because of the intermediate chlorine etching process, there is a cumbersome manufacturing burden of moving the WIP to a third processing chambers from step 73 to step 74 to step 75.

The fluorocarbon etching chamber is lined with non-quartz, silicon, ceramic, etc. unlike the polysilicon processing chamber which is lined with a material such as quartz. Examples of suitable commercially available plasma etching chambers are as follows: TEL85 DRM, TEL SCCM, Lam XL, Lam Exelan®, Applied Materials eMAX, Applied Materials IPS, Applied Materials P2K. There is a high wafer bias typically greater than a 200V D.C. bias for a fluorinated process, and less than 100V D.C. bias for chlorine and a lower density plasma source.

Referring to FIG. 2E, the WIP 10 of FIG. 2D is shown after step 76 in which the optional step of stripping away the hard mask HM' from the WIP 10 has been performed.

SUMMARY OF INVENTION

In accordance with this invention, a method is provided for forming a hole in a dielectric layer formed on a substrate including the following steps. Cover the dielectric layer with a deposit of an inorganic hard mask layer composed of an RCH or RCHX etch resistant material, where RCH and RCHX comprise the structural formulas R:C:H and R:C:H:X wherein R is selected from the group consisting of silicon (Si), germanium (Ge), boron (B), tin (Sn), iron (Fe), titanium (Ti) and combinations thereof, C is carbon, H is hydrogen, and X is selected from the group consisting of oxygen (O), nitrogen (N), sulfur (S), and fluorine (F). Form a photoresist mask with at least one photoresist mask window therethrough over the inorganic hard mask layer. Etch through the photoresist mask window in the photoresist layer with a fluorocarbon plasma etching process to form an inorganic hard mask by forming an opening through the inorganic hard mask layer. Then etching through the opening in the inorganic hard mask to form a hole in the dielectric layer.

Preferably, the hard mask layer comprises an RCHX material with the structural formula R:C:H:X wherein R is comprises Si and X comprises O. In addition, the fluorocarbon plasma etching process employs as follows:
a) a mixture of gases as follows
  nitrogen gas ($N_2$),
  fluorocarbon ($CHF_3$, $C_4F_8$, $C_4F_6$, $CF_4$, $CH_2F_2$, $CH_3F$),
  oxidizer ($O_2$, $CO_2$), and
  a noble diluent (Ar, He);
b) a high DC bias from 500 Volts to 3000 Volts bias on the wafer;
c) medium pressure (20 milliTorr–100 milliTorr); and
d) moderate temperatures (−20° C. to 60° C.).

In another aspect of this invention, the step of stripping the photoresist from the inorganic hard mask is performed before etching through the opening through the inorganic hard mask to form the hole in the dielectric layer.

In accordance with another preferred aspect of this invention, the hard mask layer comprises an SiCHO material with the structural formula Si:C:H:O::20:20:50:10.

In accordance with another aspect of this invention, a method is provided for forming the opening in a hard mask formed on a dielectric layer on a surface of a substrate. Cover the dielectric layer with a deposit of an SiCH or an SiCHX inorganic hard mask layer which comprises structural formula Si:C:H or Si:C:H:X and wherein X is selected form the group consisting of oxygen (O), nitrogen (N), sulfur (S), and fluorine (F). Form a photoresist mask with at least one photoresist mask window therethrough over the inorganic hard mask layer. Etch through the mask window in the photoresist layer to form an inorganic hard mask by forming an opening through the SiCH or SiCHX inorganic hard mask layer with a fluorocarbon plasma, with an inherent wafer bias >500V D.C., a high wattage power supply, a high level of polymerization during the etching process; a high anode/cathode ratio; a high voltage e-chuck design; a low to medium density plasma source, heated surfaces, or polymer sinks required to getter polymer from the gas phase. Etch a pattern into the dielectric layer through the opening through the SiCH or SiCHX inorganic hard mask layer.

BRIEF DESCRIPTION OF DRAWINGS

The foregoing and other aspects and advantages of this invention are explained and described below with reference to the accompanying drawings, in which:

FIGS. 2A–2E illustrate the problems of a process flow for a process using chlorine for etching openings in a hard mask layer on a device.

FIGS. 4A–4D show the process flow for a process in accordance with this invention using fluorocarbons for etching openings through an RCHX hard mask layer formed on a device.

FIGS. 6A and 6B are SEM cross sections of tunable etch resistant ARC using the process of this invention in which the top layer is the remaining photoresist with the ARC layer below.

FIGS. 8A and 8B are SEM cross sectional views showing the formation of an opening through hard mask tunable ARC materials and illustrating the fact that etching a hole in or through the dielectric layer can be integrated for processing in a single tool using a fluorine based etching process resulting in very high aspect ratio patterns in or through the dielectric layer.

DETAILED DESCRIPTION

Figure 1A:
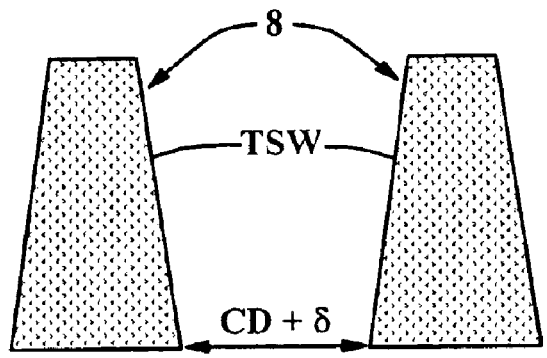
FIG. 1A illustrates a problem of loss of critical dimension encountered when processing with a conventional hard mask material.
Figure 1B:
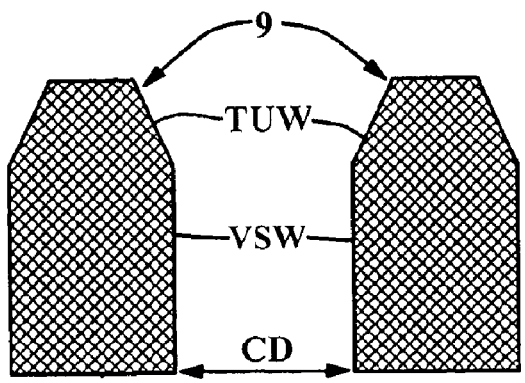
FIG. 1B shows that for tunable ARC materials patterned with the same original mask as the structures, there are vertical sidewalls below the tapered upper walls which maintain spacing with the original CD value of the mask (not shown) at the bottom of the sidewalls of the structures which are spaced by the original CD value.

The preferred embodiment of this invention is a process for producing deep patterns with high aspect ratios to form openings in a silicon oxide (also known as oxide) film for contacts, vias, active devices, interconnects, and inactive devices. Steps which involve etching of layers such as silicon oxide are traditionally "harsh" on the photoresist; but as stated above, with 193 nm photoresist systems, there is the additional challenge of "poorer" etching selectivity or stability. In an effort to address the poor etching selectivity of 193 nm photoresist systems we worked with tunable etch resistant ARC materials. During our development work, we discovered that the limitations on selectivity and cost restraints of the chlorine based mask opening were insurmountable. As a result, we then attempted to find a way to use fluorocarbon plasma etching processing to avoid the limitations caused by use of chlorine in the process.

We then discovered that a material such as an ARC material deposited by a CVD (Chemical Vapor Deposition) process, preferably PECVD (Plasma Enhanced CVD), is a natural replacement as a hard mask layer. In addition, we also have developed an integrated etching process that is cost effective over conventional etching approaches. The integrated, clean etching process of this invention delivers excellent profiles (no corner rounding) for both the hard mask and the underlying "thick" layer such as a silicon oxide film which is patterned by etching through the hard mask in accordance with the process of this invention.

In the initial etching process employed prior to development of the process of this invention, use was made of a chlorine based chemistry since state of the art fluorine based processes were nonselective to photoresist (i.e. 1:1), and had poor etching rate and CD control. All deep silicon oxide etches are performed in a fluorine based system, since chlorine and fluorine based etching chambers are incompatible due to the materials used. The fluorine based etching chambers use silicon parts exposed to the plasma (to resist fluorocarbon based etching), whereas the chlorine based tools must use quartz parts (which etch rapidly in fluorine but do not etch at all in chlorine based tools).

During the development we tried several additive compounds, and we were surprised to discover that the addition of nitrogen ($N_2$) gas in conjunction with a relatively high DC voltage bias greatly accelerated the etching rate of CVD deposited ARC material films with no consequent increase in the photoresist etching rate. Basically a 0.5:1 PECVD deposited ARC:resist $C_4F_8$ process became a 5–6:1 $C_4F_8$,+$N_2$ process, and the scaling was linear with nitrogen gas ($N_2$) addition to the atmosphere in the processing chamber. Because we were now able to etch ARC materials that had been formed by a CVD deposition process in the same tool as the subsequent silicon oxide dielectric etching process, we were able to integrate the process. Integrating the etching steps is a key advantage when using CVD deposited ARC materials in a manufacturing line, since switching tools drives up the cost (throughput and wafer handling time) and leads to defects (particles can be formed as the wafer is taken out of vacuum and moved).

Figures 3, 5:
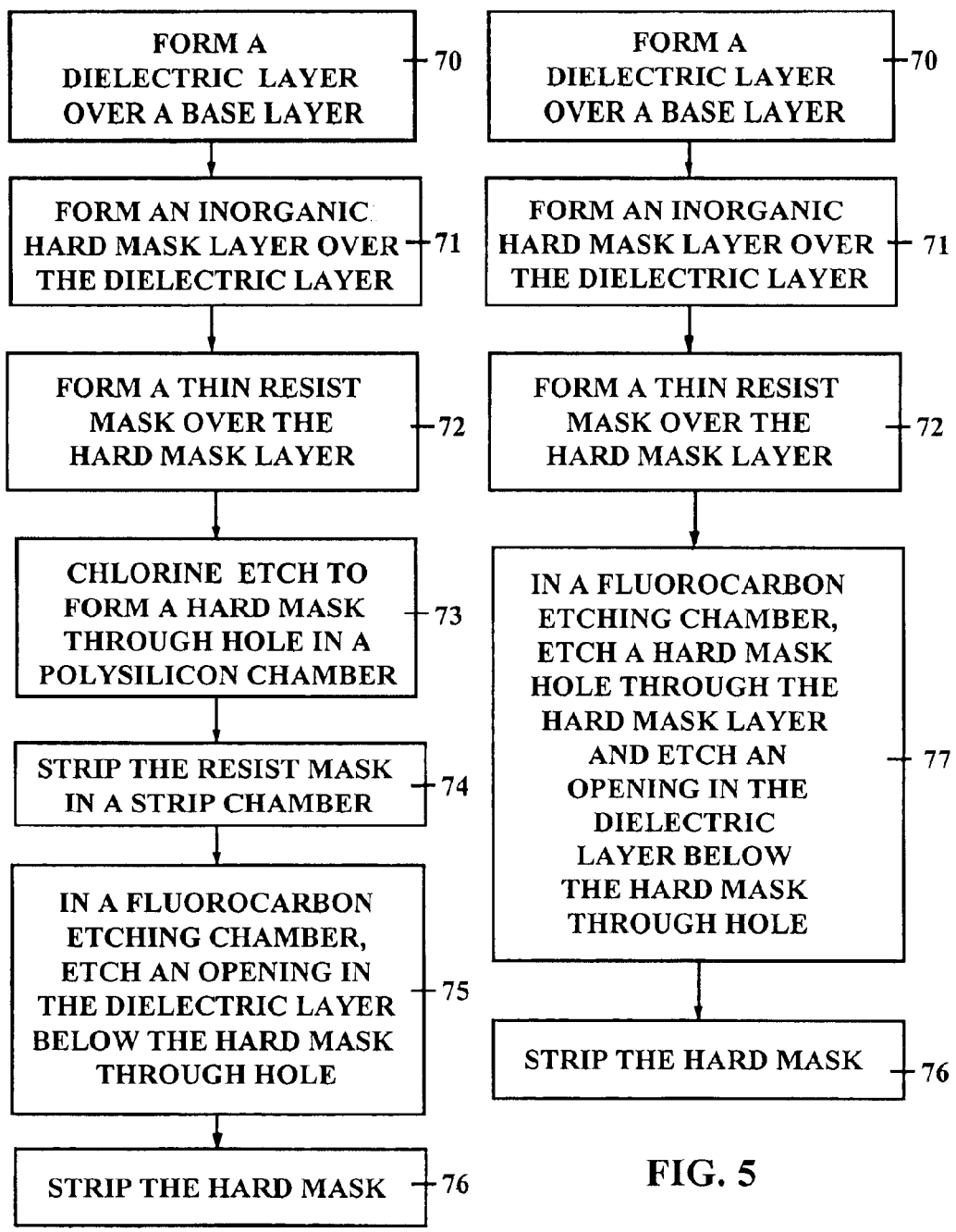
FIG. 3 is a flow chart of the process flow of the steps illustrated by FIGS. 2A–2E.
FIG. 5 is a flow chart showing the process flow of the steps illustrated by FIGS. 4A–4D.

FIGS. 4A–4D show the process flow for a process in accordance with this invention using fluorocarbons for etching openings through an RCH or RCHX hard mask layer HM formed on a device 40, hereinafter referred to as WIP 40. FIG. 5 is a flow chart showing the steps illustrated by FIGS. 4A–4D. In FIG. 4A, the WIP 40 is shown with a base layer 12 composed of a material such as silicon, a dielectric, SOI, polysilicon or the like, upon which a dielectric layer 14 has been formed in accordance with step 70 in FIG. 5. As indicated by step 71 in FIG. 5 shown in FIG. 4A, a thin film of an inorganic hard mask material HM (shown in FIG. 4A), such as an RCH material or an RCHX material, has been formed over the dielectric layer 14 of the WIP 40.

In accordance with this invention, it is preferred to use a hard mask material HM which has heretofore been employed as a tunable ARC material such as an RCHX or and an RCH material without any species from the group consisting of oxygen (O), nitrogen (N), sulfur (S), and fluorine (F). A preferred embodiment is an RCHX which is a SiCHO combination where R is silicon and X is oxygen (O) (without any nitrogen (N), sulfur (S), or fluorine (F) resulting in a hard mask composed of silicon, carbon, hydrogen, and oxygen (Si:C:H:O::20:20:50:10), which is a particular RCHX combination etched with an etchant and an etching process not described in the prior art.

The hard mask material HM is preferably a CVD ARC material deposited by a Chemical Vapor Deposition process which is preferably Plasma Enhanced Chemical Vapor Deposition (PECVD). Alternatively, Low Pressure CVD (LPCVD), High Density Plasma CVD (HDPCVD) and other CVD processes, sputtering, evaporation or the like may be employed to form the hard mask layer HM of hard mask material. Planarity of the layer is important to assure consistent etching of the thin film HM as well as a consistent aspect ratio of the openings formed therethrough.

Then in step 72 in FIG. 5, a photoresist mask PR with a window 20 therethrough (shown in FIG. 4A) is formed over the hard mask HM on the WIP 40.

Referring to FIG. 4B, the WIP 40 of FIG. 4A is shown after the step 77 in FIG. 5 of using a fluorocarbon plasma etching process to form an opening 24 through the hard mask layer HM of the WIP 40 of FIG. 4A extending directly below the window 20 through mask PR down to the surface of the dielectric layer 14 transforming the hard mask layer HM into a hard mask HM" with an opening 24 therethrough, as the result of step 77. Unlike step 73 in FIG. 3, step 77 in FIG. 5 is performed in a fluorocarbon processing chamber saving the number of changes of chambers and the number of steps involved in the process. After the opening 24 has been formed through the hard mask HM", the plasma etching process continues to etch the dielectric 14 in the fluorine plasma, employing process parameters in accordance with this invention.

In a process in accordance with this invention ($C_4F_8/N_2$ . . . ) the plasma processing system employs liners resistant to polymerizing fluorine (non-quartz, silicon, ceramic, etc.) The system employs a high inherent wafer bias (>500V D.C.), a high wattage power supply; a high anode/cathode ratio; a high voltage e-chuck design; a high level of polymerization during the etching process; a low to medium density plasma source, heated surfaces, or polymer sinks required to getter polymer from the gas phase. Integrated cleans are often used.

Some commercially available plasma etching chambers suitable for use in this process are as follows: TEL85 DRM, TEL SCCM of Tokyo Electron Ltd. (TEL) of Tokyo, Japan. Lam XL and Lam Exelan® of Lam Research, Applied Materials eMAX, Applied Materials IPS, Applied Materials P2K.

For example, a TEL Dipole Ring Magnetron (DRM) etching tool called the Unity DRM is described in U.S. Pat. No. 6,014,943 to Arami et al. in which a semiconductor wafer is subjected to a plasma atmosphere, which is generated by introducing a process gas into a process vessel and converting the process gas into a plasma-state gas. The plasma chamber includes a plasma generating area, a susceptor provided in the process vessel for supporting a substrate having a process surface, and a gas inlet means for introducing a process gas such as a CF series etching gas (such as a $CF_4$ gas or a $C_4F_8$ gas) is supplied from the process gas supply source into the plasma generating area. A dipole ring magnet which surrounds the outer periphery of the chamber, generates a magnetic field having magnetic lines of force in the plasma generating area. The dipole ring magnet comprises many cylindrical permanent magnets arranged on an oval track. The magnets have the same shape and size and are magnetized in the diameter direction.

Another example of a tool is the capacitively coupled etch Magnetically Enhanced Reactive Ion Etch (MERIE) reactor described in Liu et al. U.S. Pat. No. 6,451,703 entitled "Magnetically Enhanced Plasma Etch Process Using a Heavy Fluorocarbon Etching Gas" which illustrates the eMax reactor available from Applied Materials. It includes a grounded vacuum chamber, perhaps including liners to protect the walls. A wafer is inserted into the chamber and placed on a cooled cathode pedestal with an electrostatic chuck that clamps the wafer into position. An RF power supply, preferably operating at 13.56 MHz, is connected to the cathode pedestal to power generation of a plasma, while controlling the DC self-bias. Electromagnetic coils powered by current surround the chamber and generate a slowly rotating DC magnetic field that increases the plasma density. Shields protect the chamber. The composition of an etching gas is $C_4F_6$, oxygen in combination with a chemically inactive carrier gas which is selected from the group consisting of argon and xenon and containing essentially no carbon monoxide. Etching gases for etching oxide over a feature having a non-oxide composition are described in U.S. Pat. No. 6,387,287 of Hung which describes use of fluorocarbon and large amounts of argon for etching oxide in a magnetically enhanced reactive ion etcher (MERIE), such as the Applied Materials eMax.

In the Lam Exelan® dual frequency plasma processing chamber described in U.S. Pat. No. 6,410,451 of Nguyen et al. entitled Techniques for Improving Etching in a Plasma Processing Chamber dual RF sources are coupled to the lower electrode in the chamber.

A preferred embodiment of a plasma etching process in accordance with this invention employs the gases and parameters as follows:

a) a mixture of gases as follows:
nitrogen gas ($N_2$),
fluorocarbon ($CHF_3$, $C_4F_8$, $C_4F_6$, $CF_4$, $CH_2F_2$, $CH_3F$),
oxidizer ($O_2$, $CO_2$), and
a noble diluent (Ar, He);

b) a high DC bias (500 Volts to 3000 Volts bias on the wafer);

c) medium pressure (20 milliTorr–100 milliTorr); and d) moderate temperatures (−20° C. to 60° C.)

In this case there is no need to avoid cross-contamination of the tunable etch resistant ARC materials since they have not been etched in a chlorine plasma. Moreover, while there is no need to strip the photoresist, there is the option that the photoresist can be stripped in the same chamber as the process step.

Referring to FIG. 4C, the WIP 40 of FIG. 4B is shown after step 75 in FIG. 5 of performing a step of fluorocarbon plasma etching through the opening 24 in the hard mask HM to form an opening 34 through dielectric layer 14 down to the base layer 12. The fluorocarbon plasma etching of step 75 is performed in the same fluorocarbon processing chamber as step 77 which eliminates the cumbersome manufacturing burden of moving the Work In Process (WIP) to a third processing chamber as described above in connection with the process of FIG. 3, i.e. moving the WIP 10 through two or three processing chambers from step 73 to step 75 from FIGS. 2A–2E.

Referring to FIG. 4D, the WIP 40 of FIG. 4C is shown after step 76 in the optional step of stripping away the hard mask HM from the WIP 40 has been performed.

The details of RCHX films and deposition methods are discussed in the Angelopoulos patent cited above and are incorporated herein by reference.

In summary the process of this invention provides for patterning tunable etch resistant ARC materials as a hard mask in the same tool using compatible chemistry as underlying dielectric materials. This reduces the number of etching tools required, reduces Raw Process Time (RPT), and allows us to use photoresist for both the hard mask opening and dielectric etching for maximum selectivity. RPT is the time a wafer spends in a given tool during processing, it does not include scheduling time or wait time during manufacturing. By having an integrated process, we save RPT by not having to use another tool(s) and all the process stabilization time and associated overhead. In addition we do not require an extra tool for stripping (etching) the hard mask and removing photoresist. In other words the present invention saves both on costs and RPT. The current etching process provides a clean, integrated process that delivers excellent profiles (no corner rounding) for both the hard mask and the underlying "thick" silicon oxide film.

The process of this invention achieves higher selectivity of tunable etch resistant ARC materials to photoresist (via polymerization), integrates the tunable ARC materials open on the dielectric tool, and allows maximum utilization of the photoresist for both tunable ARC materials and dielectrics. Moreover, we developed a novel etching process for tunable ARC materials in the dielectric chamber.

By including nitrogen and a relatively high level of fluorine (e.g. $CHF_3$) in the process of FIGS. 4B and 5, tunable ARC materials can be etched by the same tool as the dielectric chamber, and with much higher selectivity than the previous chlorine process of FIGS. 2B and 3 as shown by FIGS. 6A/6B which are SEM cross sections of tunable etch resistant ARC using the process of this invention. The top layer in FIGS. 6A/6B is the remaining photoresist with the tunable ARC layer below.

Figure 7:
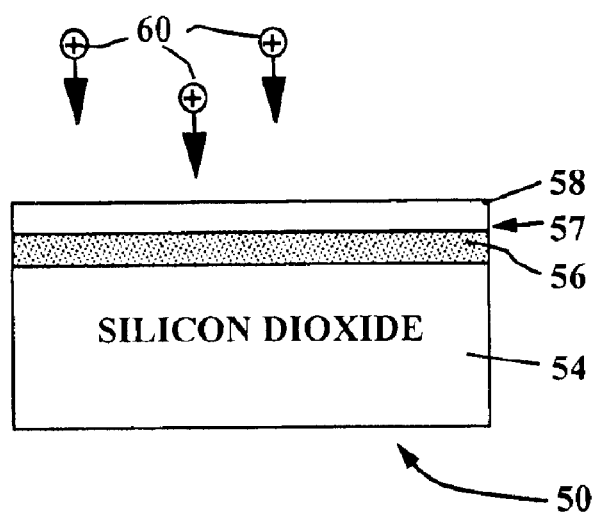
FIG. 7 shows a device being bombarded with incoming high energy positive ions with the bottom layer formed of silicon oxide coated with a dissociated layer which is releasing free radical oxygen and a deposited upper polymer layer. The interface between the dissociated layer and the upper polymer layer involves the combustion of the deposited polymer layer occurring at the interface.

This result can be explained in retrospect by the removal of surface polymer on the tunable ARC materials by highly excited $N_2$ states, rather than ion mixing which is typical of silicon dioxide etching in fluorocarbons. This is illustrated in FIG. 7 where a device 50 is shown being bombarded with incoming high energy positive ions 60. The bottom layer 54 of device 50 is formed of silicon oxide coated with a dissociated layer 56 which is releasing free radical oxygen, and a deposited upper polymer layer 58. The interface 57 between the dissociated layer 56 and the upper polymer layer 58 involves the combustion of the deposited polymer layer 58 occurring at the interface 57.

A theoretical explanation of the process of this invention is that the base etching process with fluorocarbon provides both fluorine (F) and carbon-fluorine ($CF_x$) radicals and ions to the surfaces of both the photoresist and the hard mask. Since the hard mask contains carbon (C), it may be that deposition of CFx polymer precursors (e.g. $CF_2$) overpowers the removal of the polymer by oxygen (O) radicals. Nitrogen gas ($N_2$) is a highly bound diatomic molecule, and reaches a high vibrational energy (from electron collisions) in the gas phase. We believe that this highly excited nitrogen gas molecule as it diffuses into the surface of hard mask HM and dissociating the polymer on the surface of hard mask HM, while combines with atoms of carbon (C) which are removed from hard mask layer HM as follows: $2+e \rightarrow N_2^*$ (highly excited $N_2$ molecule) $N_2^* + CF_2$ (polymer on the surface) $\rightarrow CN+N+F_2$ (all gaseous, i.e. polymer is etched) or $N_2^* + R-C-N-O$ (hard mask material) $\rightarrow CN+N+NO$ (all gaseous, i.e. hard mask is etched).

Aside from the above theory, the positive results on the wafer are clear, i.e. addition of nitrogen $N_2$ dramatically increases the etching rate of hard mask HM, whereas the etching rate of photoresist mask PR does not increase very much.

The regime of etching tunable ARC materials to form an opening there through operates in a similar plasma and polymerization regime to the dielectric etching, and is not expected to affect the tool performance significantly.

FIGS. 8A and 8B show that the step of forming an opening through the hard mask tunable ARC materials and the step of etching a hole 32/34 in or through the dielectric layer can be integrated to be performed in a single tool using a fluorine based etching process The result of the integrated fluorine based etching processing is that very high aspect ratio patterns are opened in or through the dielectric layer.

FIG. 8A is an SEM cross sections of a BoroSilicon Glass (BSG) layer with a thickness of 1.8 micrometers and with an array of openings formed therein using the method of this invention with using 193 nm wavelength lithography using a tunable etch resistant ASC hard mask layer for patterning.

FIG. 8B is an SEM of a cross section for an MC level (local interconnect or contact level) with no corner rounding observed application in a multilayer structure with multiple conductor levels including the MC level as will be well understood by those skilled in the art of semiconductor electronics. Note the flat profile of the tunable etch resistant ASC hard mask layer due to the low sputter yield in standard silicon oxide chemistry.

In accordance with this invention, a novel etch process for opening tunable ARC materials films selective to 193 nm photoresist in a fluorocarbon plasma using: a) mixture of gases as follows: nitrogen gas ($N_2$), fluorocarbon ($CHF_3$, $C_4F_8$, $C_4F_6$, $CF_4$, $CH_2F_2$, $CH_3F$), an oxidizer ($O_2$, $CO_2$), and a noble diluent (Ar, He). b) a high DC bias (500 Volts to 3000 Volts bias on the wafer) c) medium pressure (20–100 millitorr), d) moderate temperatures (–20 to 60°).

The invention involves an integration process whereby the tunable ARC materials mask film is patterned in the dielectric tool, and the balance of photoresist, as well as the tunable ARC materials film, is used to open the underlying dielectric material. This integrated process includes the removal of photoresist in-situ.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of forming a hole in a dielectric layer formed on a substrate comprising:

covering the dielectric layer with a deposit of an inorganic hard mask layer composed of an etch resistant material selected from the group consisting of RCH and RCHX, wherein R is selected from the group consisting of silicon (Si), germanium (Ge), boron (B), tin (Sn), iron (Fe), titanium (Ti) and combinations thereof, C is carbon, H is hydrogen, and X is selected form the group consisting of oxygen (O), nitrogen (N), sulfur (S), and fluorine (F), forming a resist mask with at least one resist mask window therethrough over the inorganic hard mask layer, placing the substrate covered with the dielectric layer, the inorganic hard mask and the resist mask in a fluorocarbon etching chamber while applying a DC bias in the fluorocarbon etching chamber and then performing the steps as follows:

etching through the resist mask window in the resist layer with a fluorocarbon plasma etching process to form an inorganic hard mask by forming an opening through the inorganic hard mask layer in the fluorocarbon etching chamber, and then etching through the opening in the inorganic hard mask to form a hole in the dielectric layer in the fluorocarbon etching chamber.

2. The method of claim 1 including the step of stripping the photoresist from the inorganic hard mask in the fluorocarbon etching chamber before etching through the opening through the inorganic hard mask to form the hole in the dielectric layer.

3. The method of claim 1 wherein the fluorocarbon plasma etching process employs as follows:
   a) a mixture of gases as follows;
      nitrogen gas ($N_2$);
      fluorocarbon gas selected from the group consisting of $CHF_3$, $C_4F_8$, $C_4F_6$, $CF_4$, $CH_2F_2$, and $CH_3F$,
      an oxidizer gas selected from the group consisting of $O_2$ and $CO_2$; and
      a noble diluent gas selected from the group consisting of Ar and, He;
   b) a high DC bias from about 500 Volts to about 3000 Volts bias on the wafers;
   c) medium pressure from about 20 milliTorr to about 100 milliTorr; and
   d) moderate temperatures from about −20° C. to about 60° C.

4. The method of claim 3 including the step of stripping the photoresist from the inorganic hard mask in the fluorocarbon etching chamber before etching through the opening through the inorganic hard mask to form the hole in the dielectric layer.

5. The method of claim 1 wherein the hard mask layer comprises an SiCHO, 20:20:50:10 material.

6. The method of claim 5 including the steps of
   stripping the photoresist from the inorganic hard mask in the fluorocarbon etching chamber before etching through the opening through the inorganic hard mask to form the hole in the dielectric layer; and
   stripping the inorganic hard mask from the dielectric layer in the fluorocarbon etching chamber after forming the hole.

7. The method of claim 5 including the step of stripping the photoresist from the inorganic hard mask in the fluorocarbon etching chamber before etching through the opening through the inorganic hard mask to form a hole in the dielectric layer.

8. The method of claim 7 wherein the fluorocarbon plasma etching process employs as follows:
   a) a mixture of gases as follows
      nitrogen gas ($N_2$);
      a fluorocarbon gas selected from the group consisting of $CHF_3$, $C_4F_8$, $C_4F_6$, $CF_4$, $CH_2F_2$, and $CH_3F$,
      an oxidizer gas selected from the group consisting of $O_2$ and $CO_2$;
      a noble diluent gas selected from the group consisting of Ar and, He;
   b) a high DC bias from about 500 Volts to about 3000 Volts bias on the wafer;
   c) medium pressure from about 20 milliTorr to about 100 milliTorr; and
   d) moderate temperatures from about −20° C. to about 60° C.

9. The method of claim 1 wherein the hard mask layer comprises an RCHX material wherein R comprises silicon (Si) and X comprises oxygen (O).

10. The method of claim 9 wherein the fluorocarbon plasma etching process employs as follows:
    a) a mixture of gases as follows:
       nitrogen gas ($N_2$);
       a fluorocarbon gas selected from the group consisting of $CHF_3$, $C_4F_8$, $C_4F_6$, $CF_4$, $CH_2F_2$, and $CH_3F$,
       an oxidizer gas selected from the group consisting of $O_2$ and $CO_2$;
       a noble diluent gas selected from the group consisting of Ar and, He;
    b) a high DC bias from about 500 Volts to about 3000 Volts bias on the wafer;
    c) medium pressure from about 20 milliTorr to about 100 millitorr; and
    d) moderate temperatures from about −20° C. to about 60° C.

11. The method of claim 10 including the step of stripping the photoresist from the inorganic hard mask before etching through the opening through the inorganic hard mask to form the hole in the dielectric layer.

12. The method of claim 10 including the step of stripping the photoresist from the inorganic hard mask in the fluorocarbon etching chamber before etching through the opening through the inorganic hard mask to form the hole in the dielectric layer, and
    stripping the inorganic hard mask from the dielectric layer in the fluorocarbon etching chamber after forming the hole.

13. A method of forming an opening in a hard mask formed on a dielectric layer on a surface of a substrate comprising:
    covering the dielectric layer with a deposit of an inorganic hard mask layer composed of a material selected from the group consisting of SiCH and SiCHX, wherein X is selected from the group consisting of oxygen (O), nitrogen (N), sulfur (S), and fluorine (F),
    forming a photoresist mask with at least one photoresist mask window therethrough over the inorganic hard mask layer,
    placing the substrate covered with the dielectric layer, the inorganic hard mask and the photoresist mask in a fluorocarbon etching chamber and then performing the steps with a D.C. bias voltage of at least about 500 Volts as follows:
       etching through the mask window in the photoresist layer to form an inorganic hard mask by forming an opening through the SiCH or SiCHX inorganic hard mask layer with a fluorocarbon plasma, with an inherent wafer bias with a minimum value of about 500V D.C., a power supply, polymerization during the etching process; a plasma source, heated surfaces, or polymer sinks required to getter polymer from the gas phase, and
       etching a pattern into the dielectric layer through the opening through the SiCH or SiCHX inorganic hard mask layer.

14. The method of claim 13 wherein the hard mask layer comprises an RCHX material wherein X comprises O.

15. The method of claim 13 wherein the fluorocarbon plasma etching process employs as follows:
    a) a mixture of gases as follows:
       nitrogen gas ($N_2$);
       a fluorocarbon gas selected from the group consisting of $CHF_3$, $C_4F_8$, $C_4F_6$, $CF_4$, $CH_2F_2$, and $CH_3F$,
       an oxidizer gas selected from the group consisting of $O_2$ and $CO_2$;
       a noble diluent gas selected from the group consisting of Ar and, He;
    b) a high DC bias from about 500 Volts to about 3000 Volts bias on the wafer;
    c) medium pressure from about 20 milliTorr to about 100 millitorr; and d) moderate temperatures from about −20° C. to about 60° C.

16. The method of claim 13 including the step of stripping the photoresist from the inorganic hard mask before etching through the opening through the inorganic hard mask to form the hole in the dielectric layer.

17. A method of forming a hole in a dielectric layer formed on a substrate comprising:

covering the dielectric layer with an inorganic hard mask layer composed of an etch resistant material selected from the group consisting of RCH and RCHX etch resistant material, wherein R is selected from the group consisting of silicon (Si), germanium (Ge), boron (B), tin (Sn), iron (Fe), titanium (Ti) and combinations thereof, C is carbon, H is hydrogen, and X is selected form the group consisting of oxygen (O), nitrogen (N), sulfur (S), and fluorine (F), forming a photoresist mask with at least one photoresist mask window therethrough over the inorganic hard mask layer, placing the substrate covered with the dielectric layer, the inorganic hard mask and the photoresist mask in a fluorocarbon etching chamber and then performing the steps while applying a DC bias with a minimum value of about 500 Volts as follows:

etching through the photoresist mask window in the photoresist layer with a fluorocarbon plasma etching process to form an inorganic hard mask by forming an opening through the inorganic hard mask layer in the fluorocarbon etching chamber, and then etching through the opening in the inorganic hard mask to form a hole in the dielectric layer in the fluorocarbon etching chamber.

* * * * *